US012695451B2

(12) United States Patent
Dutta

(10) Patent No.: US 12,695,451 B2
(45) Date of Patent: Jul. 28, 2026

(54) HIGH-SPEED DYNAMIC-IMPEDANCE DIGITAL CMOS GATE DRIVERS FOR WIDE BAND-GAP POWER DEVICES

(71) Applicant: Kinetic Technologies International Holdings LP, Toronto (CA)

(72) Inventor: Siddharth Dutta, San Jose, CA (US)

(73) Assignee: Kinetic Technologies International Holdings LP, Toronto (CA)

( * ) Notice: Subject to any disclaimer, the term of this patent is extended or adjusted under 35 U.S.C. 154(b) by 51 days.

(21) Appl. No.: 18/759,630

(22) Filed: Jun. 28, 2024

(65) Prior Publication Data

US 2024/0356547 A1      Oct. 24, 2024

Related U.S. Application Data

(63) Continuation of application No. 17/875,188, filed on Jul. 27, 2022, now Pat. No. 12,028,064.

(51) Int. Cl.
*H03K 19/00* (2006.01)
*H03K 19/0185* (2006.01)

(52) U.S. Cl.
CPC . *H03K 19/0005* (2013.01); *H03K 19/018571* (2013.01)

(58) Field of Classification Search
None
See application file for complete search history.

(56) References Cited

U.S. PATENT DOCUMENTS 6,366,867 B2 *   4/2002   Sine .................... G01R 31/3185
326/27
6,636,069 B1 *  10/2003   Muljono .............. H03K 17/164
326/86

(Continued)

FOREIGN PATENT DOCUMENTS

CN        103475359 A    12/2013
CN        110727396 A     1/2020
KR     10-0695416 B1     3/2007

OTHER PUBLICATIONS

PCT International Search Report and the Written Opinion mailed Nov. 9, 2023, issued in related International Application No. PCT/US2023/028749 (9 pages).

(Continued)

*Primary Examiner* — Anh Q Tran
(74) *Attorney, Agent, or Firm* — Sheppard Mullin Richter & Hampton LLP

(57)                    ABSTRACT

One aspect disclosed features an apparatus comprising: an input buffer configured to receive an input voltage pulse as an input, and to output, responsive to a leading edge of the input voltage pulse, a logic high voltage pulse at a first output of the input buffer and a logic low voltage pulse at a second output of the input buffer; an array of L active pull-up devices electrically coupled between a positive supply rail and an output node, each active pull-up device driven by the logic high voltage pulse as modulated by a corresponding bit of a series of N first L-bit binary words; and an array of L active pull-down devices electrically coupled between a negative supply rail and the output node, each active pull-down device driven by the logic low voltage pulse as modulated by a corresponding bit of a series of M second L-bit binary words.

20 Claims, 10 Drawing Sheets

(56)         References Cited

U.S. PATENT DOCUMENTS

| | | | |
|---|---|---|---|
| 7,518,395 B1 * | 4/2009 | Chen | H03K 19/01721 |
| | | | 326/29 |
| 7,999,523 B1 * | 8/2011 | Caffee | H03K 19/00361 |
| | | | 327/134 |
| 8,373,455 B1 | 2/2013 | McLaughlin et al. | |
| 10,778,220 B2 | 9/2020 | Hwang et al. | |
| 2007/0057691 A1 | 3/2007 | Lee | |
| 2012/0169381 A1 | 7/2012 | Mei | |
| 2014/0002146 A1 | 1/2014 | Kim | |
| 2016/0233859 A1 | 8/2016 | Roberts et al. | |
| 2017/0338821 A1 | 11/2017 | Tanaka | |
| 2022/0076716 A1 | 3/2022 | Um et al. | |

OTHER PUBLICATIONS

Search Report dated Apr. 17, 2024, issued in related Taiwan Application No. 112128086 (2 pages).
Non-Final Office Action dated Oct. 18, 2023, issued in related U.S. Appl. No. 17/875,188 (12 pages).
Office Action and Search Report dated Jan. 30, 2026, issued in Taiwan Patent Application No. 114103391, with English machine translation (24 pages).

* cited by examiner

HIGH-SPEED DYNAMIC-IMPEDANCE DIGITAL CMOS GATE DRIVERS FOR WIDE BAND-GAP POWER DEVICES

CROSS REFERENCE TO RELATED APPLICATIONS

The present application is a continuation of U.S. patent application Ser. No. 17/875,188, filed Jul. 27, 2022, and titled "High-Speed Dynamic-Impedance Digital CMOS Gate Drivers for Wide Band-Gap Power Devices," the content of which is hereby incorporated by reference in its entirety.

DESCRIPTION OF RELATED ART

The disclosed technology relates generally to electronic circuits, and more particularly some embodiments relate to digital gate drivers for power devices.

SUMMARY

In general, one aspect disclosed features an apparatus comprising: an input buffer configured to receive an input voltage pulse as an input, and to output, responsive to a leading edge of the input voltage pulse, a logic high voltage pulse at a first output of the input buffer and a logic low voltage pulse at a second output of the input buffer; an array of L active pull-up devices electrically coupled between a positive supply rail and an output node, each active pull-up device driven by the logic high voltage pulse as modulated by a corresponding bit of a series of N first L-bit binary words; and an array of L active pull-down devices electrically coupled between a negative supply rail and the output node, each active pull-down device driven by the logic low voltage pulse as modulated by a corresponding bit of a series of M second L-bit binary words.

Embodiments of the apparatus may include one or more of the following features. In some embodiments, a duration of each first L-bit binary word is the same as a duration of each second L-bit binary word. In some embodiments, each active pull-up device comprises: a low-voltage active pull-up device electrically coupled to the positive supply rail; and a high-voltage active pull-up device electrically coupled between the low-voltage pull-up device and the output node. In some embodiments, the low-voltage active pull-up device is driven by a respective bit of the first L-bit binary word; and the high-voltage active pull-up device is biased at a predetermined bias voltage below a voltage of the positive supply rail.

In some embodiments, the low-voltage pull-up device is a first PMOS transistor; and the high-voltage pull-device is a second PMOS transistor. In some embodiments, a source of the first PMOS transistor is electrically coupled to the positive supply rail; a drain of the first PMOS transistor is electrically coupled to a source of the second PMOS transistor; and a drain of the second PMOS transistor is electrically coupled to the output node. In some embodiments, a gate of the first PMOS transistor is driven by a respective bit of the first L-bit binary word; and a gate of the second PMOS transistor is biased at the predetermined bias voltage below the voltage of the positive supply rail.

Some embodiments comprise an array of L switches each controlled by a respective bit of each of the first L-bit binary words; wherein a first logic state of a bit causes the respective switch to couple an input of the respective active pull-up device to the positive supply rail; and wherein a second logic state of a bit causes the respective switch to couple the input of the respective active pull-up device to the first output of the input buffer. Some embodiments comprise L buffers, wherein each buffer is electrically coupled between a respective switch and a respective active pull-up device.

In some embodiments, each active pull-down device comprises: a low-voltage active pull-down device electrically coupled to the negative supply rail; and a high-voltage active pull-down device electrically coupled between the low-voltage pull-down device and the output node. In some embodiments, the low-voltage active pull-down device is driven by a respective bit of each second L-bit binary word; and the high-voltage active pull-down device is biased a predetermined bias voltage above a voltage of the negative supply rail.

In some embodiments, the low-voltage pull-down device is a first NMOS transistor; and the high-voltage pull-down device is a second NMOS transistor. In some embodiments, a source of the first NMOS transistor is electrically coupled to the negative supply rail; a drain of the first NMOS transistor is electrically coupled to a source of the second NMOS transistor; and a drain of the second NMOS transistor is electrically coupled to the output node. In some embodiments, a gate of the first NMOS transistor is driven by a respective bit of the second L-bit binary word; and a gate of the second NMOS transistor is biased at the predetermined bias voltage above the voltage of the negative supply rail.

Some embodiments comprise an array of L switches each controlled by a respective bit of each second L-bit binary word; wherein a first logic state of a bit causes the respective switch to couple an input of the respective active pull-down device to the negative supply rail; and wherein a second logic state of a bit causes the respective switch to couple the input of the respective active pull-down device to the second output of the input buffer. Some embodiments comprise L buffers, wherein each buffer is electrically coupled between a respective switch and a respective active pull-down device.

Some embodiments comprise an integrated circuit comprising the apparatus. Some embodiments comprise an external transistor driven by the output node. In some embodiments, the external transistor is a field-effect transistor.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

In recent years there has been growing demand for high-frequency, high-temperature, and high-power-density applications in the power electronics industry, for example in application areas including automotive, renewable energy, smart grids, and data centers. In such applications, transistors realized using Wide Band Gap materials such as GaN and SiC have been key enablers as successors to CMOS devices. However, there are many design challenges in driving gates of GaN power transistors, including tight restrictions on operating gate voltage, EMI and reliability issues due to large voltage and current slew rates, and need for high-frequency timing control. There are a few main methods currently being used to drive GaN devices.

Figure 1:
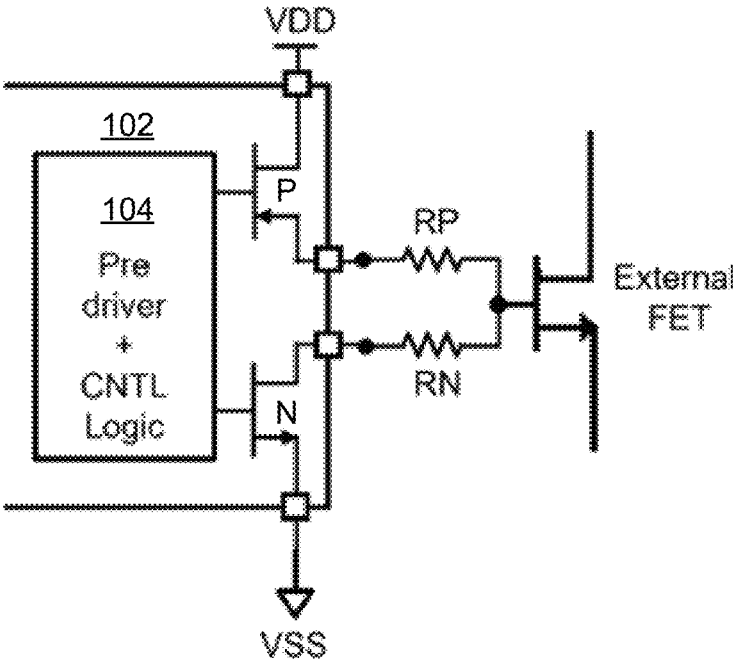
FIG. 1 is a circuit block diagram of a current approach using a standard CMOS driver with external damping resistors to drive an external field-effect transistor (FET).

One current approach employs external damping resistors. FIG. 1 is a circuit block diagram of a current approach using a standard CMOS driver with external damping resistors to drive an external field-effect transistor (FET). Referring to FIG. 1, the circuit includes a CMOS chip 102 that drives an external FET through a pull-up resistor RP and a pull-down resistor RN. The CMOS chip 102 includes a pre-driver+control (CNTL) logic 104 that drives a pull-up transistor P connected to the pull-up resistor RP, and a pull-down transistor N connected to the pull-down resistor RN. The resistors RP and RN are connected to drive a gate of the external FET, which may be implemented as a GaN power transistor.

This approach suffers from numerous disadvantages. It requires external resistors for damping, according to (r≥2 $\sqrt{L/c}$) where L is the inductance and C is the capacitance seen by the driver when driving the external FET gate. The values of the external resistors RP and RN must be chosen based on actual L and C values including parasitic inductance. Different values for resistors RP and RN may be needed for pull-up and pull-down of the gate of the external FET depending on the physical arrangement of the gate driver and external FET combination. The resistors RP and RN slow the rise/fall time preventing full utilization of the switching speed of the external FET. The efficiency is lower than what is possible without damped transitions. It is difficult with this approach to a generate narrow pulse (~1 ns) for applications such as LiDAR or Time of Flight (ToF) measurements.

Figure 2:
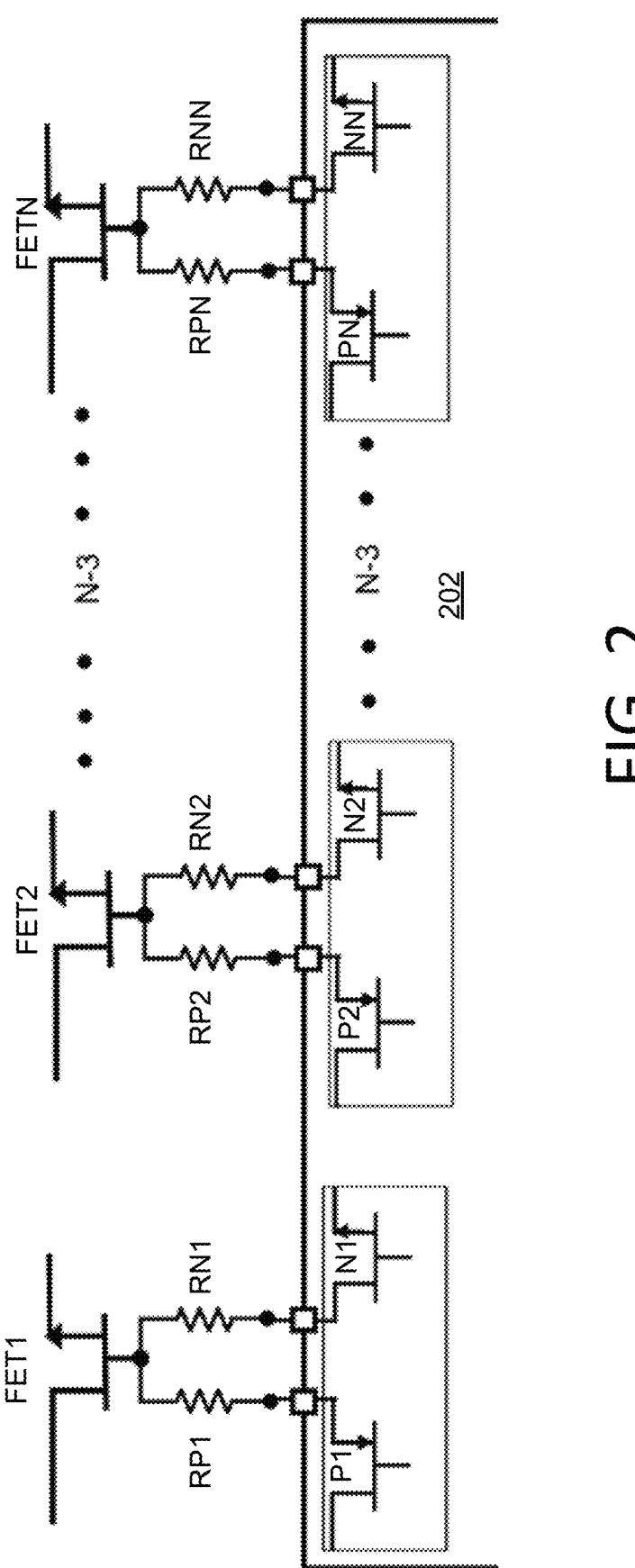
FIG. 2 is a circuit block diagram of a current approach using multiple standard CMOS drivers with external damping resistors to drive an array of external FETs.

These disadvantages are multiplied when integrating multiple drivers. FIG. 2 is a circuit block diagram of a current approach using multiple standard CMOS drivers with external damping resistors to drive an array of external FETs. Referring to FIG. 2, the circuit includes a CMOS chip 202 and N external FETs, including FET1 and FET2 through FETN. Referring to FIG. 2, the transistors and resistors of FIG. 1 are replicated for each external FET. A first set of pull-up and pull-down transistors P1 and N1 drive pull-up and pull-down resistors RP1 and RN1, respectively, which drive a first external FET1. A second set of pull-up and pull-down transistors P2 and N2 drive pull-up and pull-down resistors RP2 and RN2, respectively, which drive a second external FET2. An Nth set of pull-up and pull-down transistors PN and NN drive pull-up and pull-down resistors RPN and RNN, respectively, which drive an Nth external FETN. This replication requires an exponential increase in resistor count because each gate driver needs a pair of external resistors, so driving an array of N external FETs requires 2N individually-tuned external resistors. It is difficult to integrate multiple drivers due to this high resistor count. Furthermore, the larger PCB footprint due to the numerous external components increases parasitic inductance.

Figure 3:
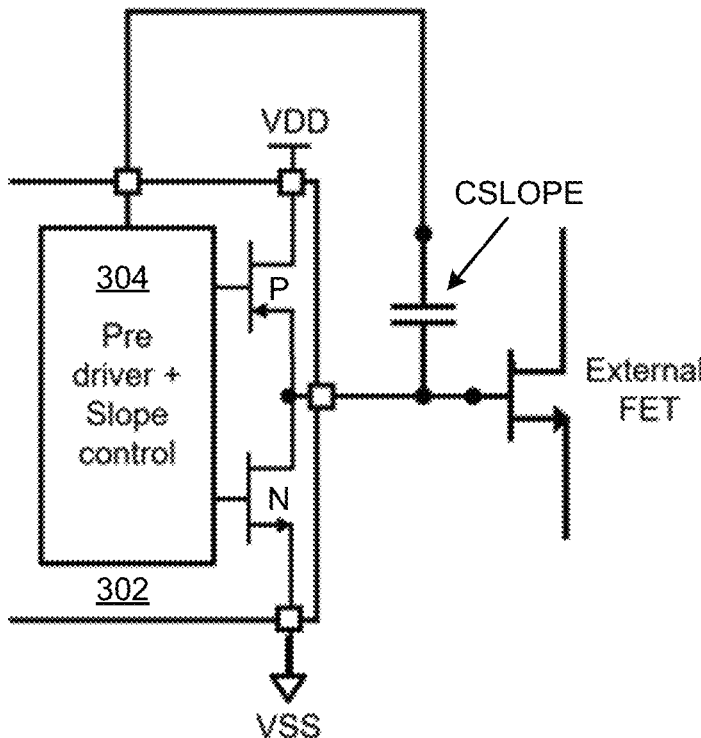
FIG. 3 is a circuit block diagram of a current approach using a standard CMOS driver with slope control to drive an external FET.

Another current approach employs slope control. FIG. 3 is a circuit block diagram of a current approach using a standard CMOS driver with slope control to drive an external FET. Referring to FIG. 3, the circuit includes a CMOS chip 302 and an external FET. The CMOS chip 302 includes a pre-driver+slope control circuit 304 that drives a pull-up transistor P and a pull-down transistor N, which drive a gate of the external FET. The external FET may be implemented as a GaN power transistor. Here the output of the CMOS chip 302 driving the external FET gate is a current instead of voltage. The pre-driver+slope control circuit 304 monitors the output signal of the CMOS chip 302 through a capacitor CSLOPE.

This approach also suffers from numerous disadvantages. It typically requires a control loop with sense current for reliable operation. This feedback control loop limits transition speed and pulse width, and increases the complexity of the circuit. It requires external capacitors to adjust for different application conditions, and may require external resistors as well to control the dynamic behavior of the circuit.

Embodiments of the disclosed technologies may employ a segmented driver architecture with an array of binary weighted drivers in parallel to realize dynamic output driver impedance. The output pulse may be divided into multiple phases, with the gate driver output impedance independently set in each of the phases. In some instances, the output phase control may be realized without any need for an external or internal clock.

The gate driver output waveform includes a positive phase and a negative phase. During the positive phase, the output of the gate driver is a logic high. During the negative phase, the output of the gate driver is a logic low. The described embodiments subdivide the logic high and logic low pulse durations into multiple phases N and M, respectively. The number of phases N and M may be independent of each other.

One of the problems with generating fast (e.g., ns) pulses to drive external devices in applications such as LiDAR or Time of Flight is the need to provide a narrow input pulse to the gate driver device. The current invention allows digitally selecting the number of phases of N and M phases to be turned on during logic high and logic low parts of the output driver waveform. This technique may generate a narrow pulse of preset duration with a much slower input signal. For example, the user can provide a 10 MHz clock to the gate driver input with a 50 ns wide pulse to generate a 1 ns pulse every 100 ns at its output instead of having to provide a 1 ns wide pulse every 100 ns, as in the case of a conventional gate driver.

Figure 4:
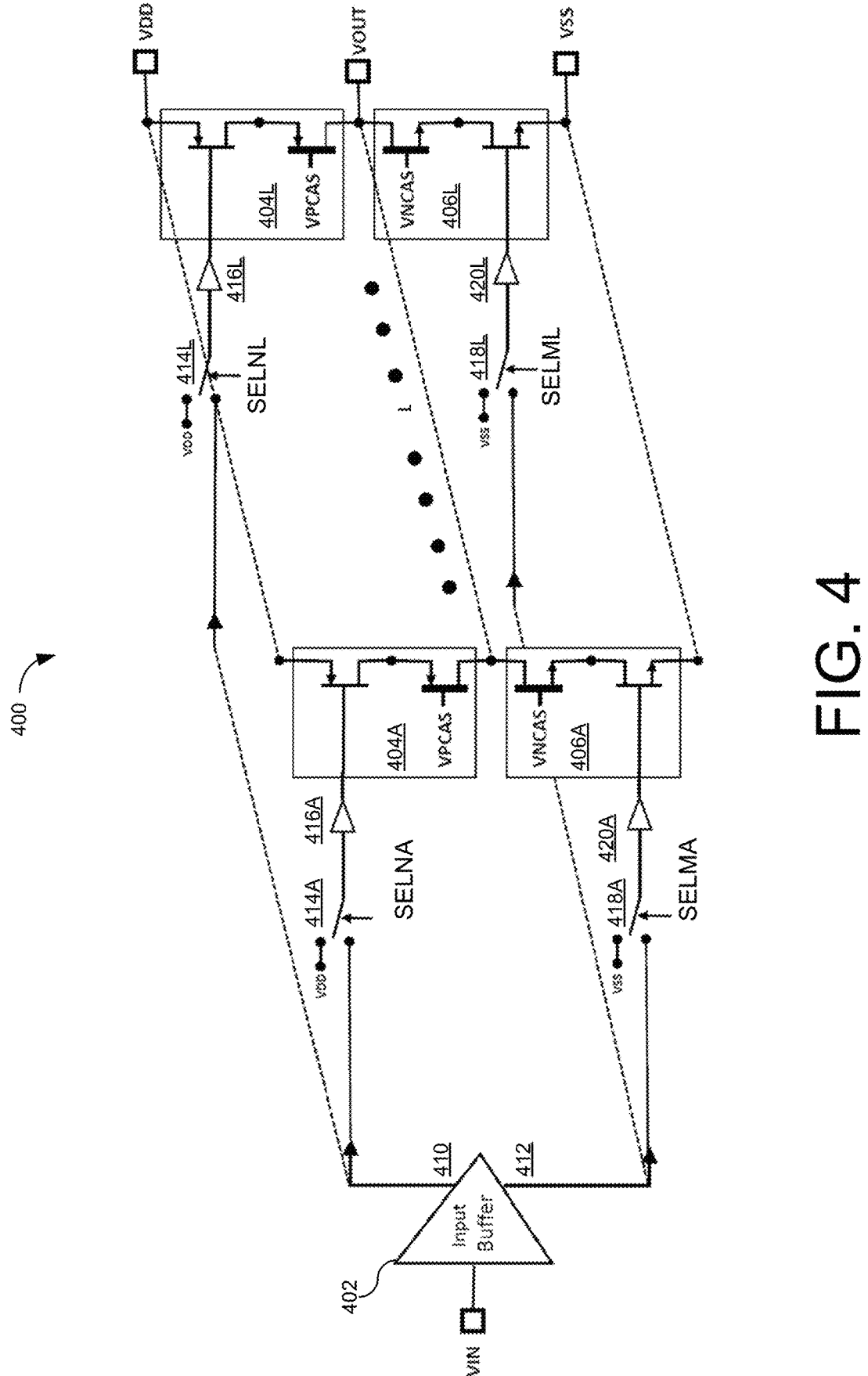
FIG. 4 illustrates a segmented driver implemented according to some embodiments of the disclosed technologies.

FIG. 4 illustrates a segmented driver 400 according to some embodiments of the disclosed technologies. The driver 400 may be implemented as an integrated circuit. Referring to FIG. 4, the driver 400 may include an input buffer 402, an array of L active pull-up devices 404A-L, and an array of L active pull-down devices 406A-L. The input of the input buffer 402 is electrically coupled an input node VIN. The input buffer 402 has a high output 410 and a low output 412.

The active pull-up devices 404A-L are electrically coupled between a positive supply rail VDD and an output node VOUT. The inputs of the active pull-up devices 404A-L are electrically coupled to the high output 410 of the input buffer 402 by switches 414A-L and buffers 416A-L. The switches 414A-L are controlled by a series of N binary L-bit words SELN having bits SELNA-SELNL. A first logic state of a bit causes the respective switch 414 to couple an input of the respective active pull-up device 404 to the positive supply rail VDD, effectively shutting that active pull-up device 404 device off. A second logic state of a bit causes the respective switch 414 to couple the input of the respective active pull-up device 404 to the high output 410 of the input buffer 402.

The active pull-down devices 406A-L are electrically coupled between a negative supply rail VSS and the output node VOUT. The inputs of the active pull-down devices 406A-L are electrically coupled to the low output 412 of the input buffer 402 by switches 418A-L and buffers 420A-L. The switches 418A-L are controlled by a series of M binary L-bit words SELM having bits SELMA-SELML. A first logic state of a bit causes the respective switch 418 to couple an input of the respective active pull-down device 406 to the negative supply rail VSS, effectively shutting that active pull-down device 406 device off. A second logic state of a bit causes the respective switch 418 to couple the input of the respective active pull-down 406 device to the low output 412 of the input buffer 402.

In some embodiments, N=M. In other embodiments, N<>M. In some embodiments, the duration of each L-bit binary word SELN is the same as a duration of each second L-bit binary word SELM. In other embodiments, the durations are not the same. Each duration can be as small as 100 ps even while using a 0.18 um standard BCD process to realize fine control of the gate driver 400. Each duration can be controlled by factory adjustment trimming of components, by using an on-chip delay-locked loop, or by similar techniques.

A delay-locked loop may be used to correct for variation between the durations of each of the words. Such a delay-locked loop can also be used to track the phase variation between multiple dynamic output impedances on the chip. This technique can be useful in applications that require driving an array of external device gates with good phase matching.

The internal circuits generating the durations for each word may automatically compensate for supply and temperature variations, and can be trimmed to correct for process variation. The trimming may be accomplished as a one-time trim at factory or by using an external passive element or external clock signal of known value during actual operation. Such run-time adjustments may be done at power on or in the background in a continuous fashion.

Figure 5:
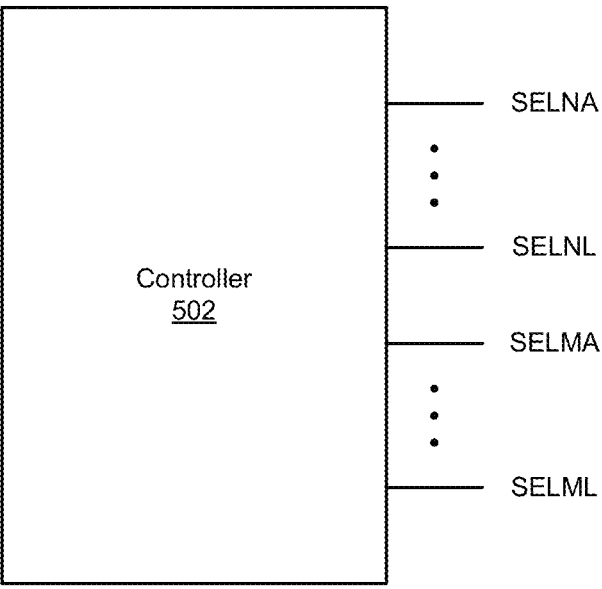
FIG. 5 is a block diagram of a controller configured to provide the binary L-bit words SELN and SELM according to some embodiments of the disclosed technologies.

FIG. 5 is a block diagram of a controller 502 configured to provide the binary L-bit words SELN (each comprising bits SELNA-SELNL) and SELM (each comprising bits SELMA-SELML) according to some embodiments of the disclosed technologies. The controller 502 may be implemented as a finite state machine or a similar controller. The values of the words SELN and SELM may be determined by coefficients stored digitally in the controller 502.

Each pair of an active pull-up device 404 and a corresponding active pull-down device 406 may be considered to be a segment. In some embodiments, each active pull-up device 404, and each active pull-down device 406, may include a combination of a low voltage device and a high voltage device in series. The devices are connected in such a way that the output node VOUT connects to the high voltage devices. This arrangement shields the low voltage devices from high output voltage transients and allows for reliable high voltage operation while using low voltage devices for controlling the pull up and pull down of the output node VOUT.

Figure 6:
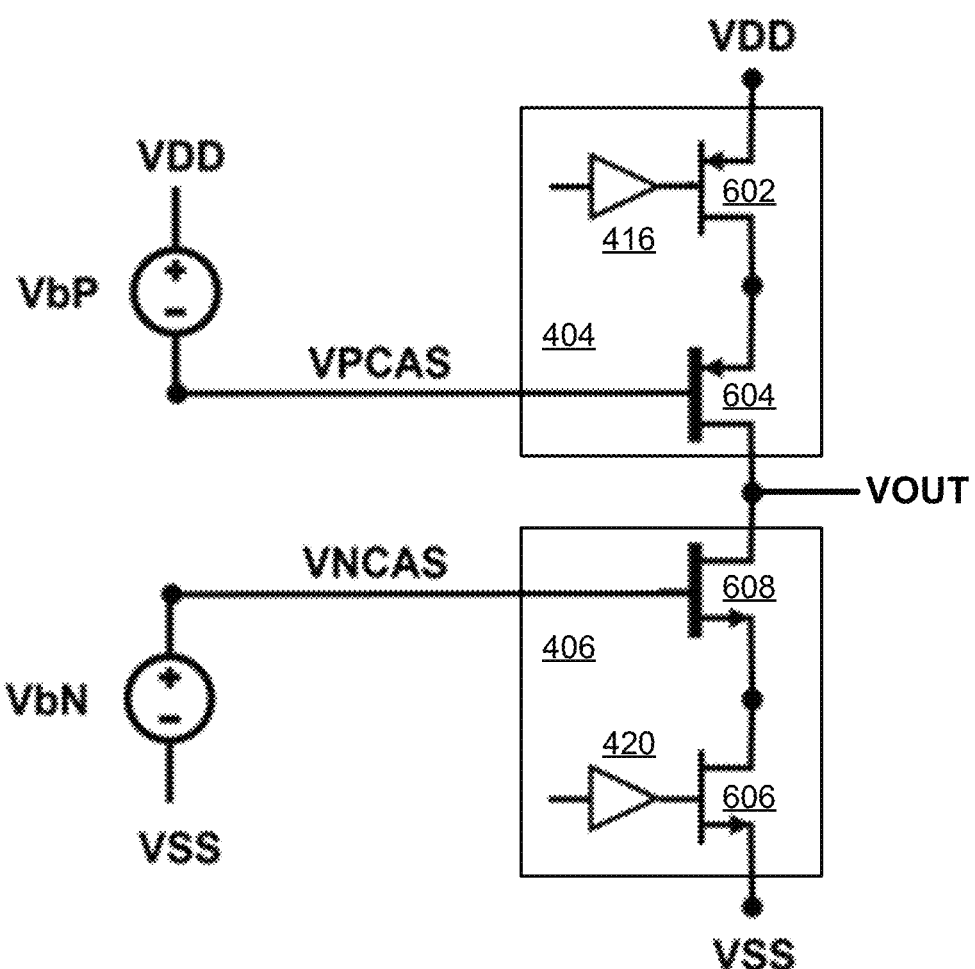
FIG. 6 is a circuit block diagram of one segment of the segmented driver of FIG. 4 according to some embodiments of the disclosed technologies.

FIG. 6 is a circuit block diagram of one segment 600 of the segmented driver 400 of FIG. 4 according to some embodiments of the disclosed technologies. Referring to FIG. 6, the active pull-up device 404 in the segment 600 may include a low-voltage active pull-up device 602 electrically coupled to the positive supply rail VDD and a high-voltage active pull-up device 604 electrically coupled between the low-voltage pull-up device 602 and the output node VOUT. The active pull-down device 406 in the segment 600 may include a low-voltage active pull-down device 606 electrically coupled to the negative supply rail VSS and a high-voltage active pull-down device 608 electrically coupled between the low-voltage pull-down device 606 and the output node VOUT. Turning the active pull-up device 404 on pulls up the output VOUT to logic high. Turning the active pull-down device 406 on pulls down the output VOUT to logic low.

In the example of FIG. 6, the active pull-up devices 602, 604 are implemented as PMOS transistors. However, other active devices may be used. The source of the low-voltage PMOS transistor 602 may be electrically coupled to the positive supply rail VDD. The drain of the low-voltage PMOS transistor 602 may be electrically coupled to the source of the high-voltage PMOS transistor 604. The drain of the high-voltage PMOS transistor 604 may be electrically coupled to the output node VOUT.

A gate of the low-voltage PMOS transistor 602 may be electrically coupled to an output of a buffer 416. The gate of the high-voltage PMOS transistor 604 may be biased to a voltage VPCAS that may be a predetermined bias voltage VbP below the voltage of the positive supply rail VDD.

In the example of FIG. 6, the active pull-down devices 606, 608 are implemented as NMOS transistors. However, other active devices may be used. The source of the low-voltage NMOS transistor 606 may be electrically coupled to the negative supply rail VSS. The drain of the low-voltage NMOS transistor 606 may be electrically coupled to the source of the high-voltage NMOS transistor 608. The drain of the high-voltage NMOS transistor 608 may be electrically coupled to the output node VOUT.

A gate of the low-voltage NMOS transistor 606 may be electrically coupled to an output of a buffer 420. The gate of the high-voltage NMOS transistor 608 may be biased to a voltage VNCAS that may be a predetermined bias voltage VbN above the voltage of the negative supply rail VSS.

Figure 7:
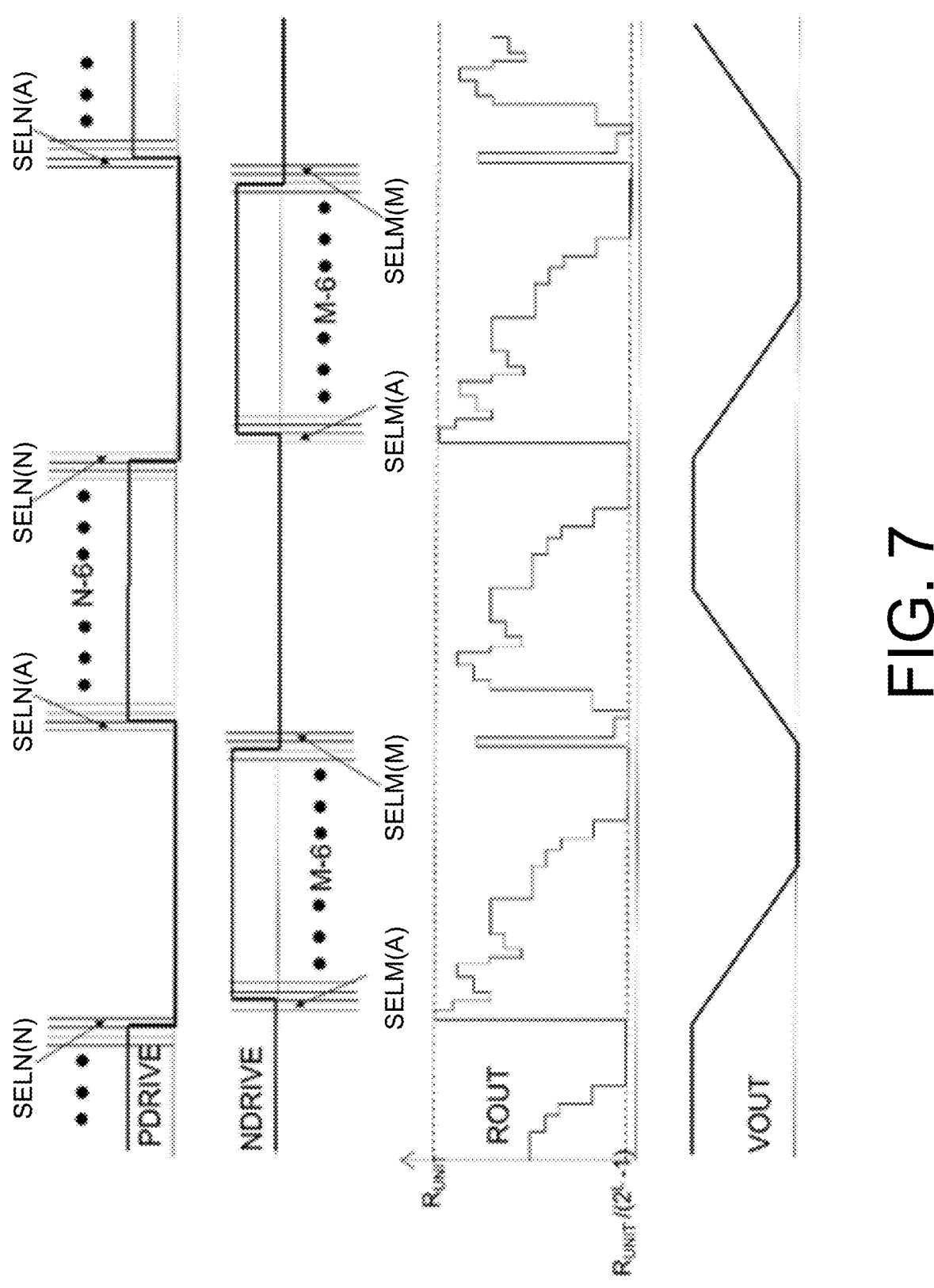
FIG. 7 is a timing diagram for the segmented driver of FIG. 4 according to some embodiments of the disclosed technologies.

FIG. 7 is a timing diagram for the segmented driver 400 of FIG. 4 according to some embodiments of the disclosed technologies. Referring to FIGS. 4 and 7, responsive to a rising edge of an input voltage pulse at VIN, the input buffer 402 may produce a voltage pulse PDRIVE at the high output 410. During the voltage pulse PDRIVE, the controller 502 may provide a series of N binary L-bit words SELN(A)-SELN(N) to the switches 414A-L. Responsive to a falling edge of an input voltage pulse at VIN, the input buffer 402 may produce a voltage pulse NDRIVE at the low output 412. During the voltage pulse NDRIVE, the controller 502 may provide a series of M binary L-bit words SELM(A)-SELM (M) to the switches 418A-L. The values of the words SELN and SELM may be selected to produce a desired output impedance profile, for example as shown at ROUT in FIG. 7. In this way during any phase the output driver can have an on impedance between RUNIT and RUNIT/($2^L$−1). The resulting output waveform is illustrated at VOUT in FIG. 7.

Figure 8:
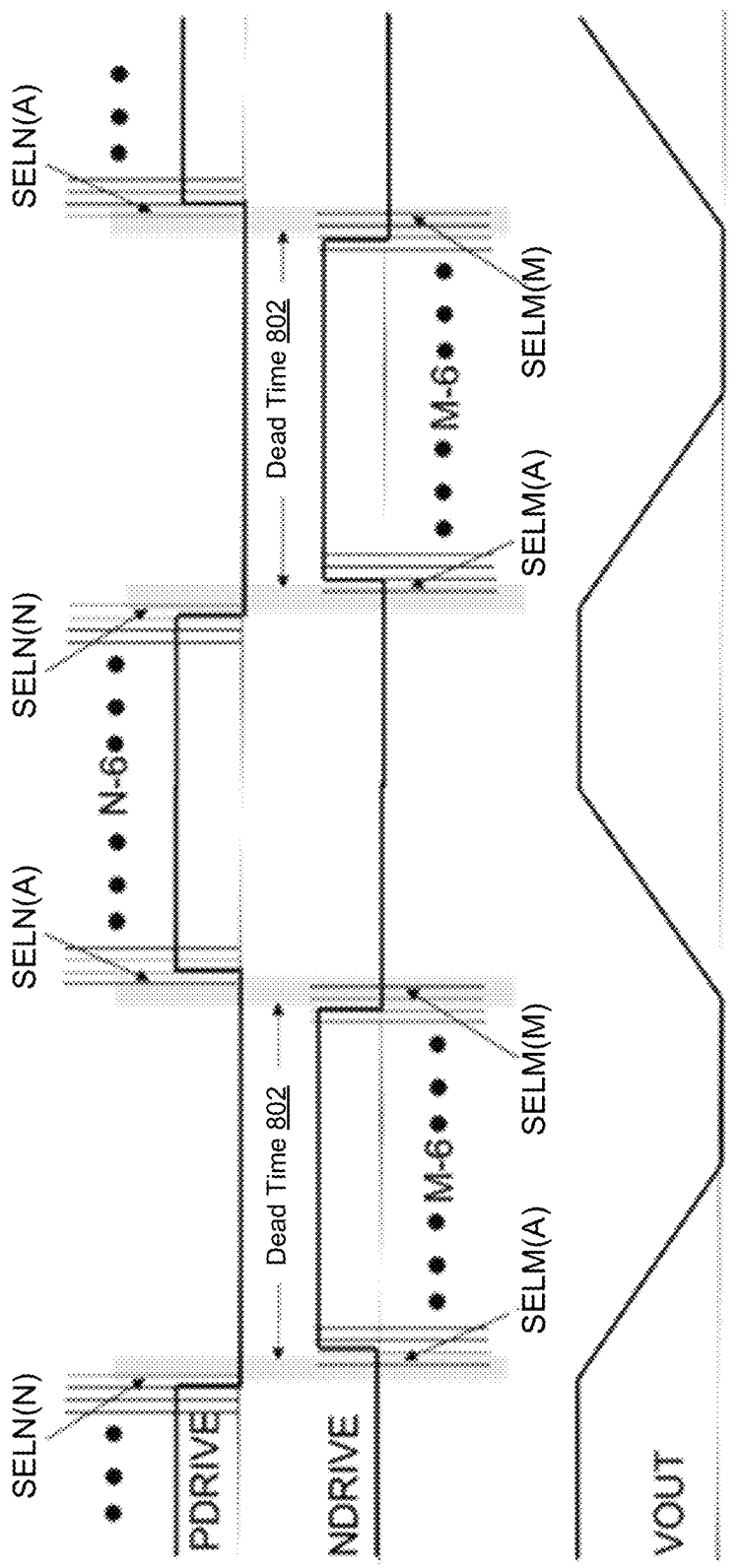
FIG. 8 is a timing diagram illustrating dead time 802 for the segmented driver of FIG. 4 according to some embodiments of the disclosed technologies.

FIG. 8 is a timing diagram illustrating dead time 802 between the falling edge of PDRIVE signal and the following rising edge of NDRIVE signal, as well as between the falling edge of NDRIVE signal and the following rising edge of PDRIVE signal for the segmented driver 400 of FIG. 4 according to some embodiments of the disclosed technologies. Since the number of segments turning on each phase is determined by coefficients A-L for each of the N and M phases, the coefficients can easily be programmed to control dead time 802 digitally with a resolution of as low as, e.g., 100 ps. This may be done in the actual application environment to achieve the best possible gate driving result for the external device and PCB layout at hand. This may help improve switching efficiency by optimizing the dead time 802, as shown in FIG. 8.

In some embodiments, the L output segments may be laid out in a common centroid fashion to minimize dynamic non-linearity (DNL) when switching output impedance from RUNIT to RUNIT/(L−1). The traces for the control words SELN and SELM may be laid out in such a manner as to match the turn on time of each of the segments used to realize RUNIT.

The disclosed embodiments may use digital logic and digital delays to accomplish the dynamic impedance driving. As such, there is very low standby power consumption and, in addition, inherent robustness to noise as well as supply and ground bounce.

In many applications EMI as a result of high-frequency ringing during output waveform transitions is a big concern. The disclosed dynamic impedance drive approach may help mitigate EMI issues by the selection of appropriate coefficient values of the output driver phases close to high-to-low and low-to-high transitions of the driver output waveform.

The ability to dynamically alter the output driver impedance in a controlled manner with fine (e.g., 100 ps) increments allows digital control of the ramp-up and ramp-down slopes of the external device gate voltage. This eliminates the need for an external capacitor as conventionally used for slope control.

The lack of external resistors or capacitors for gate driving makes the disclosed technology more amenable to integration of multiple gate drivers in a single chip. When driving an array of external devices with a single chip comprised of multiple gate drivers, each gate driver can be independently tuned for its particular target device and PCB parasitics by storing appropriate digital coefficients in the controller 502

The disclosed technology lends itself to tuning in the field to get the best achievable result for a given set of application conditions. The fine digital control of output driver states can be incorporated in a feedback loop for automatic control of parameters of interest in the target application.

Figure 9:
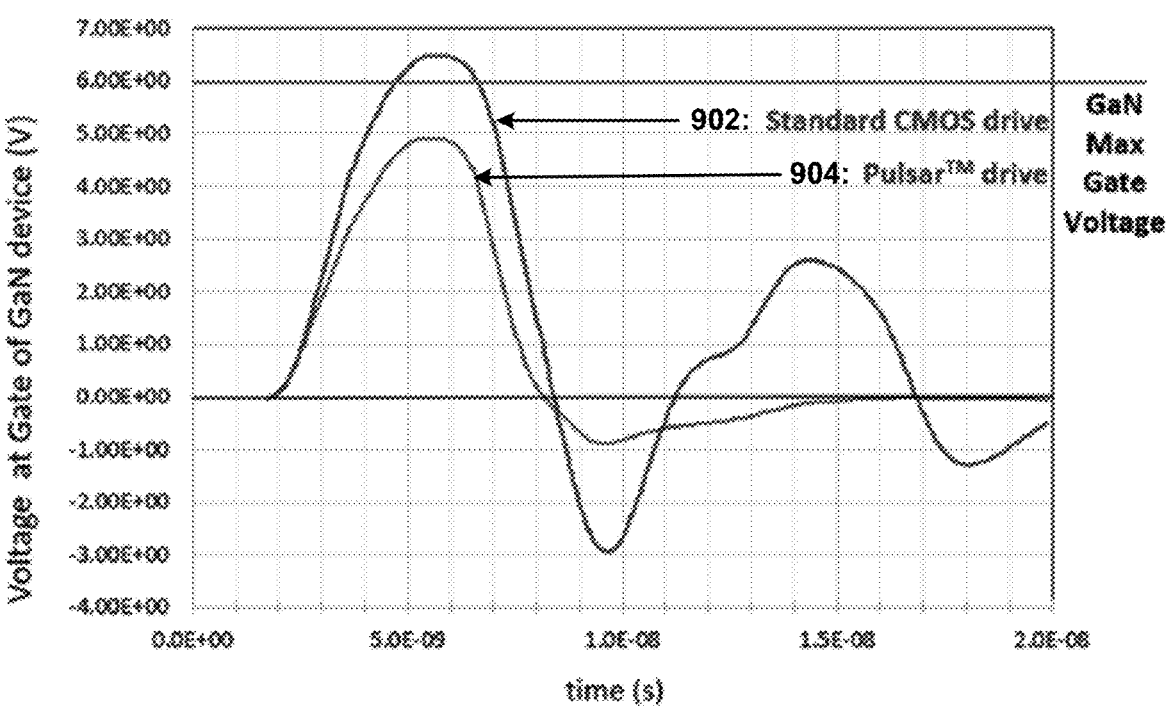
FIG. 9 illustrates the gate voltage at the gate of an EPC2019 Enhancement Mode Power Transistor GaN device for a standard conventional CMOS gate driver vs. a gate driver implemented according to the disclosed technologies.

FIGS. 9-12 illustrate test results for current approaches and for embodiments of the disclosed technology. FIG. 9 illustrates the gate voltage at the gate of an EPC2019 Enhancement Mode Power Transistor GaN device for a standard conventional CMOS gate driver vs. a gate driver implemented according to the disclosed technologies. Referring to FIG. 9, the curve 902 illustrates the gate voltage when driven by a positive pulse generated using a conventional gate driver. The desired effect of the driver is to turn on the GaN device for a period of ~5 ns from ~3 ns to ~8 ns by driving the gate voltage above 1.2V, which is the threshold of the GaN device, for that duration. As can be seen with curve 902, the conventional driver exhibits undesirable behavior, for example as follows. The excursions beyond 6V exceeds the absolute maximum gate voltage of the GaN device. The excursion above 1.2V after the 10 ns mark will cause the GaN device to turn on a second time, which is not desired. The negative excursions put additional stress on the GaN device gate, reducing its lifetime.

The curve 904 illustrates the gate voltage when driven by a positive pulse generated using a gate driver implemented according to the disclosed technologies. As can be seen with curve 904, the GaN device is turned on for a duration of ~5 ns without stressing its gate beyond its maximum operating voltage of 6V, and without resulting in an undesired second turn-on of the device.

Figure 10:
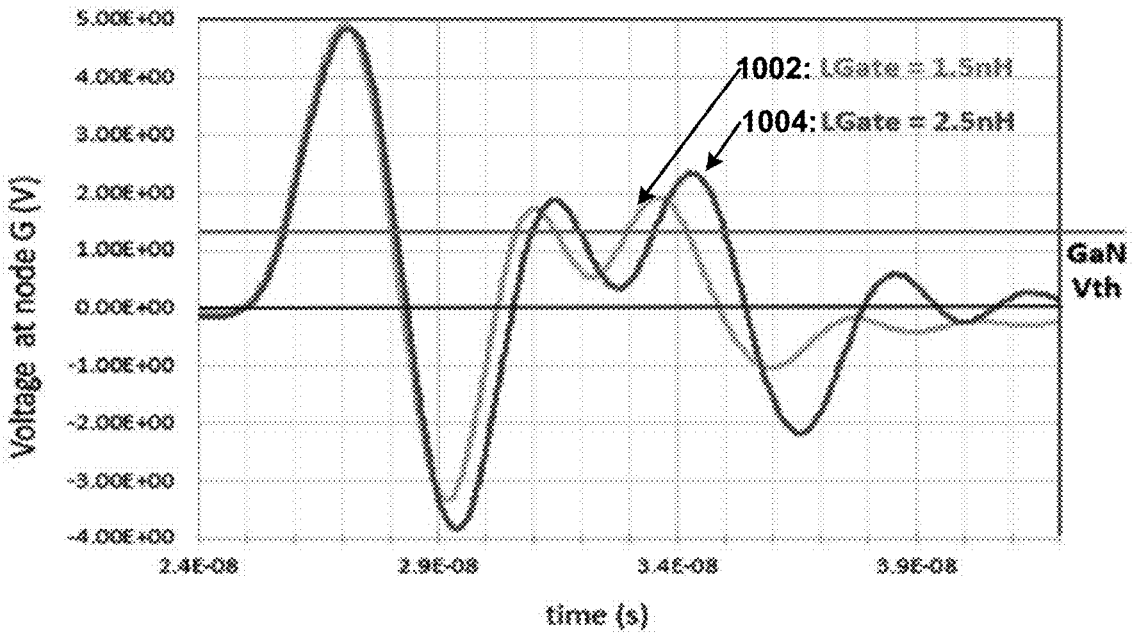
FIG. 10 illustrates ringing at the gate of the EPC2019 GaN device when driven by a narrow positive pulse generated using a conventional gate driver.

FIG. 10 illustrates ringing at the gate of the EPC2019 GaN device when driven by a narrow positive pulse generated using a conventional gate driver. The desired effect of the driver is to turn on the GaN device for a period of ~2 ns from ~25.8 ns to ~27.8 ns by driving the gate voltage above the 1.2V turn-on threshold Vth for that duration. The two different curves show the behavior with two different (1.5 nH and 2.5 nH) inductances in the gate drive path on a PCB. Curve 1002 shows the behavior with a 1.5 nH inductance in the gate drive path. Curve 1004 shows the behavior with a 2.5 nH inductance in the gate drive path.

From FIG. 10, it can be seen in both cases that the conventional driver produces undesired "runt" pulses following the desired initial pulse, with excursions above Vth=1.2V that will turn on the GaN device when not desired. And the negative excursions shown put additional stress on the GaN device gate, reducing its lifetime.

Figure 11:
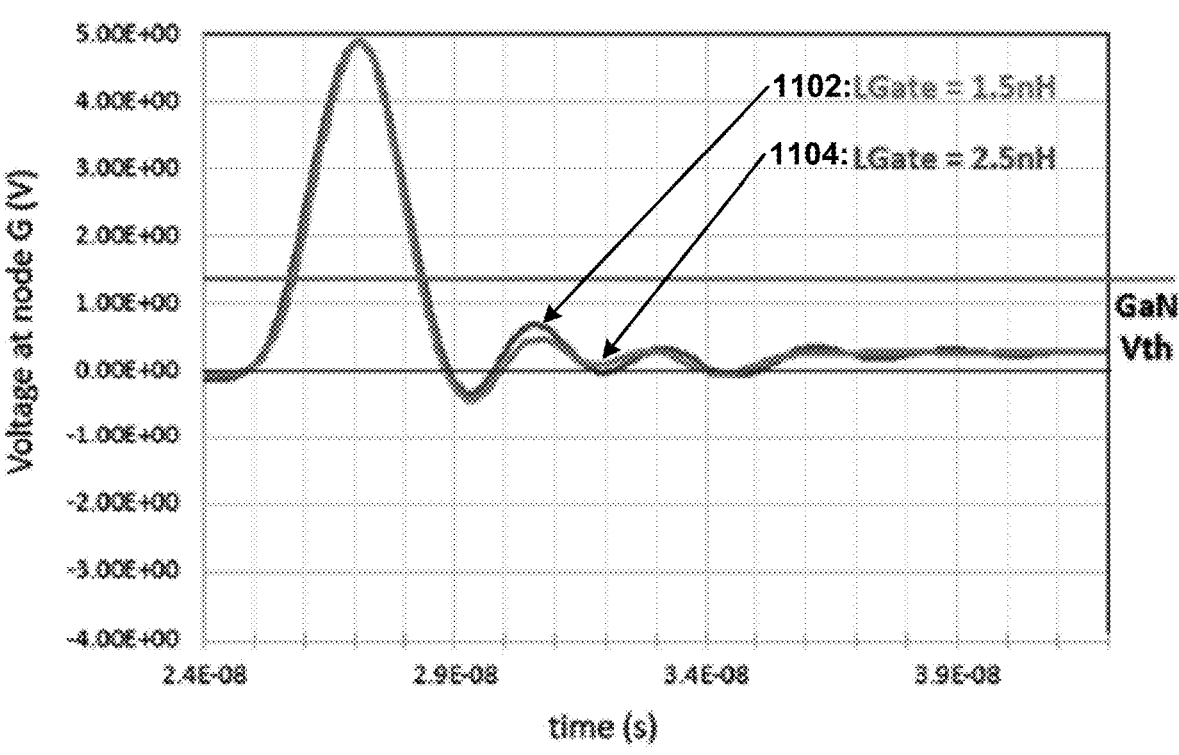
FIG. 11 illustrates the gate voltage of the EPC2019 GaN device when driven by a narrow positive pulse generated by a gate driver implemented according to some embodiments of the disclosed technologies.

FIG. 11 illustrates the gate voltage of the EPC2019 GaN device when driven by a narrow positive pulse generated by a gate driver implemented according to some embodiments of the disclosed technologies. From FIG. 11 it can be seen that there are no false turn-ons or large negative excursions. Curve 1102 shows the behavior with a 1.5 nH inductance in the gate drive path. Curve 1104 shows the behavior with a 2.5 nH inductance in the gate drive path. From FIG. 11 it can be seen that the difference in turn on behavior is very small between PCB parasitic inductance of 1.5 nH and 2.5 nH.

Figure 12:
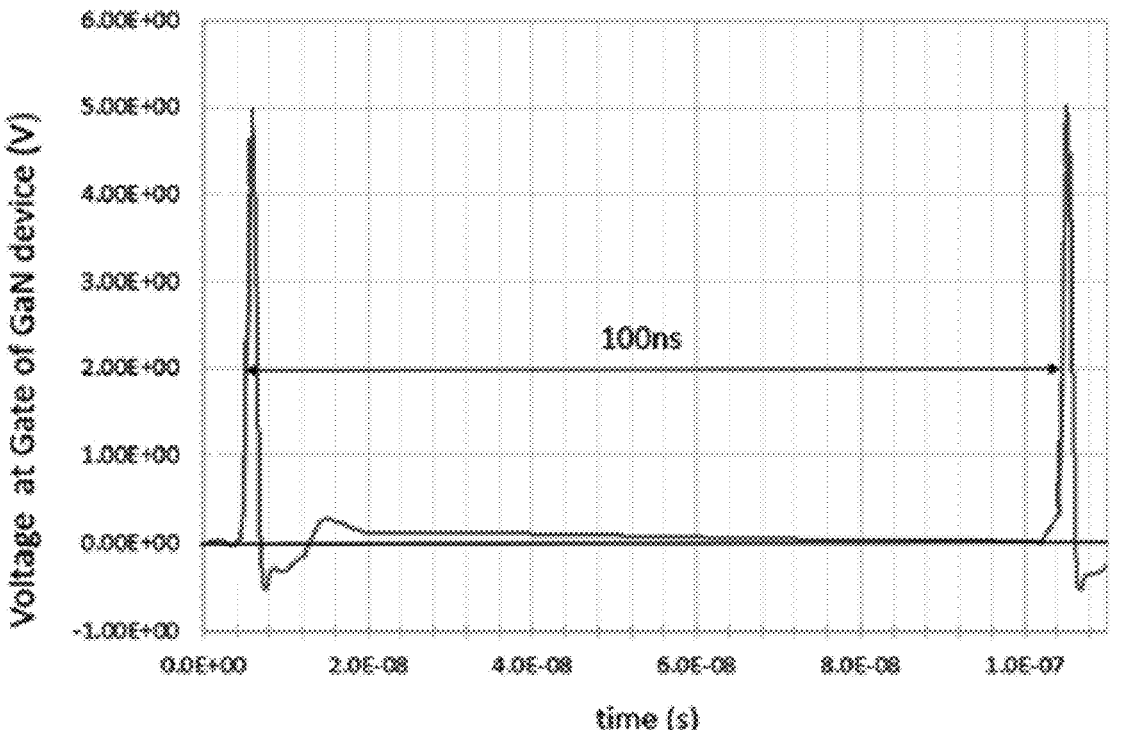
FIG. 12 illustrates the gate voltage of the EPC2019 GaN device when driven at 10 MHz with a narrow pulse of ~1.4 ns.

FIG. 12 illustrates the gate voltage of the EPC2019 GaN device when driven at 10 MHz with a narrow pulse of ~1.4 ns.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the disclosure be defined by the following claims and their equivalence.

What is claimed is:

1. An apparatus comprising:
an input buffer configured to receive an input voltage pulse as an input, and to output, responsive to a leading edge of the input voltage pulse, a logic high voltage pulse at a first output of the input buffer and a logic low voltage pulse at a second output of the input buffer;
an array of L active pull-up devices electrically coupled between a positive supply rail and an output node, each active pull-up device driven by the logic high voltage pulse as modulated by a corresponding bit of a series of N first L-bit binary words;
an array of L active pull-down devices electrically coupled between a negative supply rail and the output node, each active pull-down device driven by the logic low voltage pulse as modulated by a corresponding bit of a series of M second L-bit binary words;
an array of L first switches respectively coupled to the array of L active pull-up devices and controlled by a respective bit of each of the first L-bit binary words; and
an array of L second switches respectively coupled to the array of L active pull-down devices and controlled by a respective bit of each of the second L-bit binary words,
wherein the series of N first L-bit binary words comprises at least two different first L-bit binary words that are applied at different times during the logic high voltage pulse, and
wherein the series of M second L-bit binary words comprises at least two different second L-bit binary words that are applied at different times during the logic low voltage pulse.

2. The apparatus of claim 1, wherein each active pull-up device comprises:
a low-voltage active pull-up device electrically coupled to the positive supply rail; and
a high-voltage active pull-up device electrically coupled between the low-voltage active pull-up device and the output node.

3. The apparatus of claim 2, wherein:
the low-voltage active pull-up device is driven by a respective bit of the first L-bit binary words; and
the high-voltage active pull-up device is biased at a predetermined bias voltage below a voltage of the positive supply rail.

4. The apparatus of claim 3, wherein:
the low-voltage active pull-up device is a first PMOS transistor; and
the high-voltage active pull-up device is a second PMOS transistor.

5. The apparatus of claim 4, wherein:
a source of the first PMOS transistor is electrically coupled to the positive supply rail;
a drain of the first PMOS transistor is electrically coupled to a source of the second PMOS transistor; and a drain of the second PMOS transistor is electrically coupled to the output node.

6. The apparatus of claim 5, wherein:
a gate of the first PMOS transistor is driven by a respective bit of the first L-bit binary words; and
a gate of the second PMOS transistor is biased at the predetermined bias voltage below the voltage of the positive supply rail.

7. The apparatus of claim 1, wherein each active pull-down device comprises:
a low-voltage active pull-down device electrically coupled to the negative supply rail; and
a high-voltage active pull-down device electrically coupled between the low-voltage active pull-down device and the output node.

8. The apparatus of claim 7, wherein:
the low-voltage active pull-down device is driven by a respective bit of the second L-bit binary words; and
the high-voltage active pull-down device is biased at a predetermined bias voltage above a voltage of the negative supply rail.

9. The apparatus of claim 8, wherein:
the low-voltage active pull-down device is a first NMOS transistor; and
the high-voltage active pull-down device is a second NMOS transistor.

10. The apparatus of claim 9, wherein:
a source of the first NMOS transistor is electrically coupled to the negative supply rail;
a drain of the first NMOS transistor is electrically coupled to a source of the second NMOS transistor; and
a drain of the second NMOS transistor is electrically coupled to the output node.

11. The apparatus of claim 10, wherein:
a gate of the first NMOS transistor is driven by a respective bit of the second L-bit binary words; and
a gate of the second NMOS transistor is biased at the predetermined bias voltage above the voltage of the negative supply rail.

12. An electronic device comprising:
a transistor; and
a driver coupled to the transistor and configured to drive the transistor, wherein the driver comprises:
an input buffer configured to receive an input voltage pulse as an input, and to output, responsive to a leading edge of the input voltage pulse, a logic high voltage pulse at a first output of the input buffer and a logic low voltage pulse at a second output of the input buffer;
an array of L active pull-up devices electrically coupled between a positive supply rail and an output node, each active pull-up device driven by the logic high voltage pulse as modulated by a corresponding bit of a series of N first L-bit binary words;
an array of L active pull-down devices electrically coupled between a negative supply rail and the output node, each active pull-down device driven by the logic low voltage pulse as modulated by a corresponding bit of a series of M second L-bit binary words;
an array of L first switches respectively coupled to the array of L active pull-up devices and controlled by a respective bit of each of the first L-bit binary words; and
an array of L second switches respectively coupled to the array of L active pull-down devices and controlled by a respective bit of each of the second L-bit binary words, wherein the series of N first L-bit binary words comprises at least two different first L-bit binary words that are applied at different times during the logic high voltage pulse, and wherein the series of M second L-bit binary words comprises at least two different second L-bit binary words that are applied at different times during the logic low voltage pulse.

13. The electronic device of claim 12, wherein each active pull-up device comprises:

a low-voltage active pull-up device electrically coupled to the positive supply rail; and a high-voltage active pull-up device electrically coupled between the low-voltage active pull-up device and the output node.

14. The electronic device of claim 13, wherein:

the low-voltage active pull-up device is driven by a respective bit of the first L-bit binary words; and the high-voltage active pull-up device is biased at a predetermined bias voltage below a voltage of the positive supply rail.

15. The electronic device of claim 14, wherein:

the low-voltage active pull-up device is a first PMOS transistor; and the high-voltage active pull-up device is a second PMOS transistor.

16. The electronic device of claim 15, wherein:

a source of the first PMOS transistor is electrically coupled to the positive supply rail;

a drain of the first PMOS transistor is electrically coupled to a source of the second PMOS transistor; and a drain of the second PMOS transistor is electrically coupled to the output node.

17. The electronic device of claim 12, wherein each active pull-down device comprises:

a low-voltage active pull-down device electrically coupled to the negative supply rail; and a high-voltage active pull-down device electrically coupled between the low-voltage active pull-down device and the output node.

18. The electronic device of claim 17, wherein:

the low-voltage active pull-down device is driven by a respective bit of the second L-bit binary words; and the high-voltage active pull-down device is biased at a predetermined bias voltage above a voltage of the negative supply rail.

19. The electronic device of claim 18, wherein:

the low-voltage active pull-down device is a first NMOS transistor; and the high-voltage active pull-down device is a second NMOS transistor.

20. The electronic device of claim 19, wherein:

a source of the first NMOS transistor is electrically coupled to the negative supply rail;

a drain of the first NMOS transistor is electrically coupled to a source of the second NMOS transistor; and a drain of the second NMOS transistor is electrically coupled to the output node.

* * * * *